United States Patent
Soo et al.

(10) Patent No.: US 11,287,328 B1
(45) Date of Patent: Mar. 29, 2022

(54) THERMOCOUPLE PROTECTION GAUGE

(71) Applicant: The United States of America as Represented by the Secretary of the Navy, Indian Head, MD (US)

(72) Inventors: Michael Soo, Alexandria, VA (US); John-Mark Clemenson, Jr., Arlington, VA (US); Michael S. Kessler, LaPlata, MD (US); Adam W. Sims, Marbury, MD (US); Sam Goroshin, Montreal (CA)

(73) Assignee: The United States of America as represented by The Secretary of the Navy, Washington, DC (US)

( * ) Notice: Subject to any disclaimer, the term of this patent is extended or adjusted under 35 U.S.C. 154(b) by 63 days.

(21) Appl. No.: 16/873,957

(22) Filed: Aug. 27, 2020

(51) Int. Cl.
| | |
|---|---|
| *G01K 1/08* | (2021.01) |
| *G01K 1/02* | (2021.01) |
| *H01L 35/02* | (2006.01) |
| *G01K 7/02* | (2021.01) |
| *H01L 35/30* | (2006.01) |
| *H01L 35/32* | (2006.01) |

(52) U.S. Cl.
CPC ............... *G01K 1/08* (2013.01); *G01K 1/026* (2013.01); *G01K 7/02* (2013.01); *H01L 35/02* (2013.01); *H01L 35/30* (2013.01); *H01L 35/32* (2013.01)

(58) Field of Classification Search
CPC . G01K 1/08; G01K 1/026; G01K 7/02; H01L 35/02; H01L 35/30; H01L 35/32
See application file for complete search history.

(56) References Cited

U.S. PATENT DOCUMENTS

| 4,386,049 A | 5/1983 | Tokarz |
| 8,922,081 B2 | 12/2014 | Hull et al. |

FOREIGN PATENT DOCUMENTS

| CN | 104535211 | * | 4/2015 |
| CN | 104535211 A | | 4/2015 |

OTHER PUBLICATIONS

Tagawa et al., A two-thermocouple probe technique for estimating thermocouple time constants in flows with combustion: In situ parameter identification of a first-order lag system, Nagoya Institute of Technology, The Review of scientific instruments, vol. 69, No. 9, pp. 3370-3378 (Year: 1998).*

Tagawa, M., Shimoji, T., & Ohta, Y., "A two-thermocouple probe technique for estimating thermocouple time constants in flows with combustion: In situ parameter identification of a first-order lag system," Review of Scientific Instruments, 1998, 69(9), 3370-3378.

* cited by examiner

*Primary Examiner* — Jayne L Mershon
(74) *Attorney, Agent, or Firm* — Fredric J. Zimmerman

(57) ABSTRACT

A thermocouple (TC) protection gauge may guard TCs from flying debris and fragments in an explosive environment or demanding commercial environments. The gauge may contain multiple co-located TCs. By using the protection gauge, the survivability of the TCs is significantly increased and allows for a longer time frame of data collection. Temperature data is acquired from multiple TCs that are experiencing approximately the same gas temperature and gas velocity. The temperature data may be used to reconstruct the real gas temperature of a dynamic event. Each of the TCs has a different diameter and therefore has a different time resolved temperature trace. The individual temperature traces may be used to extrapolate the real gas temperature using, for example, a reconstruction algorithm.

10 Claims, 13 Drawing Sheets

US 11,287,328 B1

THERMOCOUPLE PROTECTION GAUGE

STATEMENT OF GOVERNMENT INTEREST

The invention described herein may be manufactured and used by or for the Government of the United States of America for Governmental purposes without the payment of any royalties thereon or therefor.

FIELD OF THE INVENTION

The invention relates in general to temperature measurement and in particular to temperature measurement in explosive fireballs and blast fields, and other high temperature and demanding environments.

BACKGROUND OF THE INVENTION

Thermocouples (TCs) have long been used for acquiring temperature data, but explosive environments make them difficult to use in near field blast applications. Exposed TCs are typically destroyed in an explosive event and are unable to provide reliable data.

A need exists for a TC protection gauge that can reliably measure temperature in explosive fireballs and blast fields, and other high temperature and demanding environments.

SUMMARY OF THE INVENTION

In one aspect, a thermocouple (TC) gauge includes a plurality of thermocouples with each thermocouple having a different wire size. A generally rectangular shell has mating halves with each half of the shell including a plurality of channels formed therein for receiving respective ones of the plurality of thermocouples. One end of the shell includes a shield in the form of a loop wherein a bead of each thermocouple is disposed in an interior opening of the shield loop. Each thermocouple may be disposed in a ceramic holder having longitudinal openings therein. The ceramic holders may be disposed in respective ones of the plurality of channels and the bead of each thermocouple may extend beyond one end of the ceramic holder into the interior opening of the shield loop. Vibration isolators may be disposed around each ceramic holder in the plurality of channels. Electrical connectors may be connected to each thermocouple and disposed in a recessed area in an end of the shell opposite the shield loop.

In some exemplary embodiments, the number of thermocouples is three and the number of channels is three.

In some embodiments, the beads are co-located within about 0.5 cm of each other. The wire sizes may be in a range of about 0.003 inches to about 0.015 inches.

The TC gauge may include an intermediate housing having a central opening in which the thermocouple shell is fixed. The intermediate housing may include a conical shaped end from which the shield loop of the thermocouple shell extends.

The TC gauge may include a tubular protective cover in which the intermediate housing is disposed. The conical shaped end of the intermediate housing extends out of the tubular protective cover. The inner diameter of the tubular protective cover may be less than the maximum diameter of the conical shaped end.

The invention will be better understood, and further aspects, objects, features, and advantages thereof will become more apparent from the following description of the exemplary embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

DETAILED DESCRIPTION OF THE INVENTION

A novel TC protection gauge may guard TCs from flying debris and fragments in an explosive environment as well as other demanding military and commercial environments. The novel gauge may contain multiple co-located TCs. By using the protection gauge, the survivability of the TCs is significantly increased and allows for a longer time frame of data collection. In some exemplary embodiments, the number of TCs is three. Temperature data may be acquired from multiple TCs that are experiencing approximately the same gas temperature and gas velocity. The temperature data may be used to reconstruct the real gas temperature of a dynamic event. Each of the TCs has a different bead diameter and time constant and therefore has a different time resolved temperature trace. The individual temperature traces may be used to extrapolate the real gas temperature using, for example, a reconstruction method.

The use of at least three TCs enables one to calculate measurement error for the extrapolated real gas temperature based on signals from three independent thermocouple pair measurements. A lesser number of thermocouples (two) would provide only a single independent pair, and, if there were only a single thermocouple, gas temperature reconstruction would not be possible.

Figure 1:
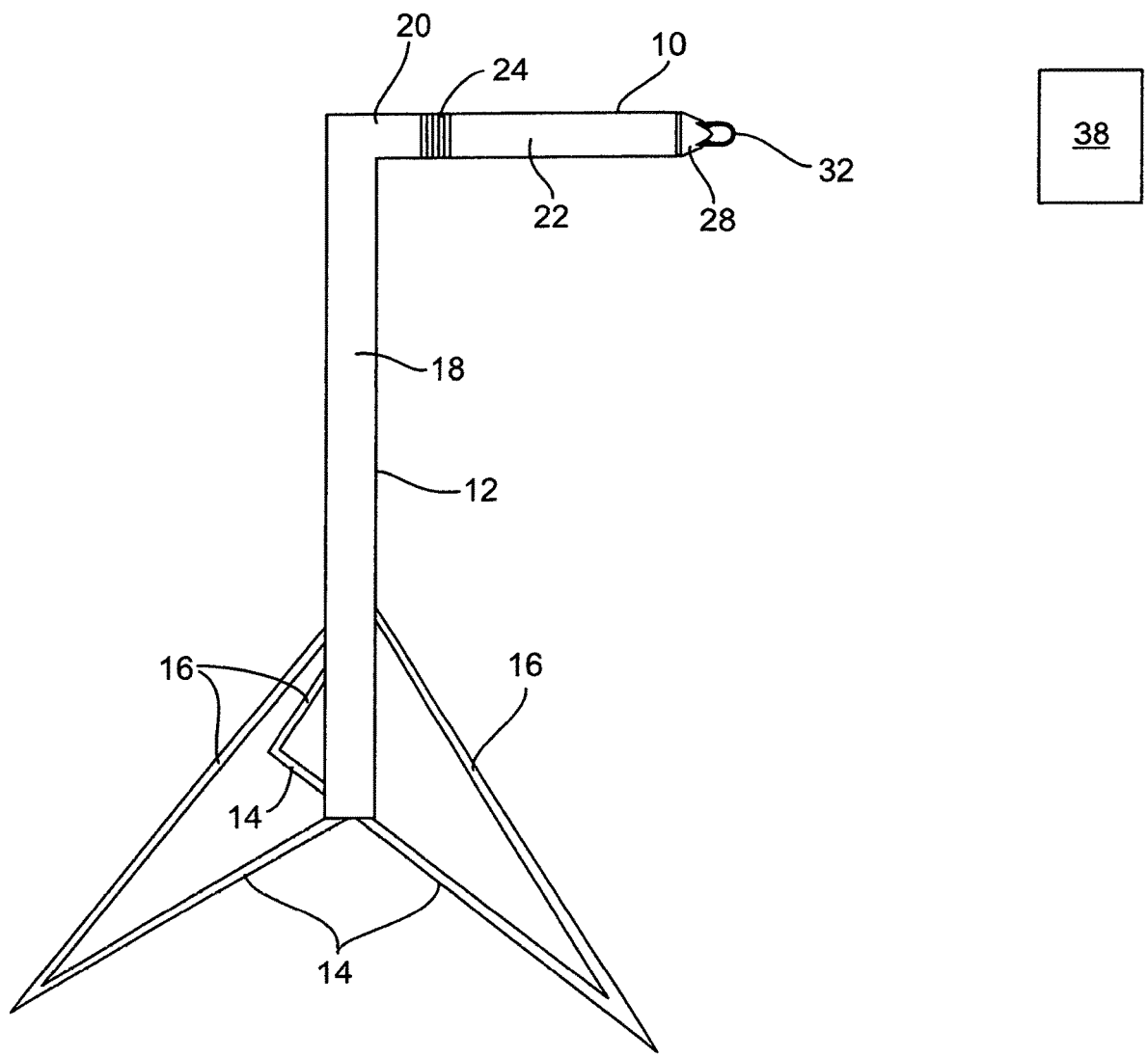
FIG. 1 is a schematic of a field stand with a TC gauge attached.

FIG. 1 is a schematic of a field stand 12 with a TC gauge 10 attached. Field stand 12 may include a plurality of feet 14 that engage the ground and a plurality of braces 16 extending from respective feet 14 to a vertical member 18. A horizontal member 20 may extend from vertical member 18. Gauge 10 may be fixed to horizontal member 20. Gauge 10 may be pointed directly at an explosive device 38. Gauge 10 may be mounted in ways other than to a field stand, for example, gauge 10 may be mounted in a wall.

Figure 2:
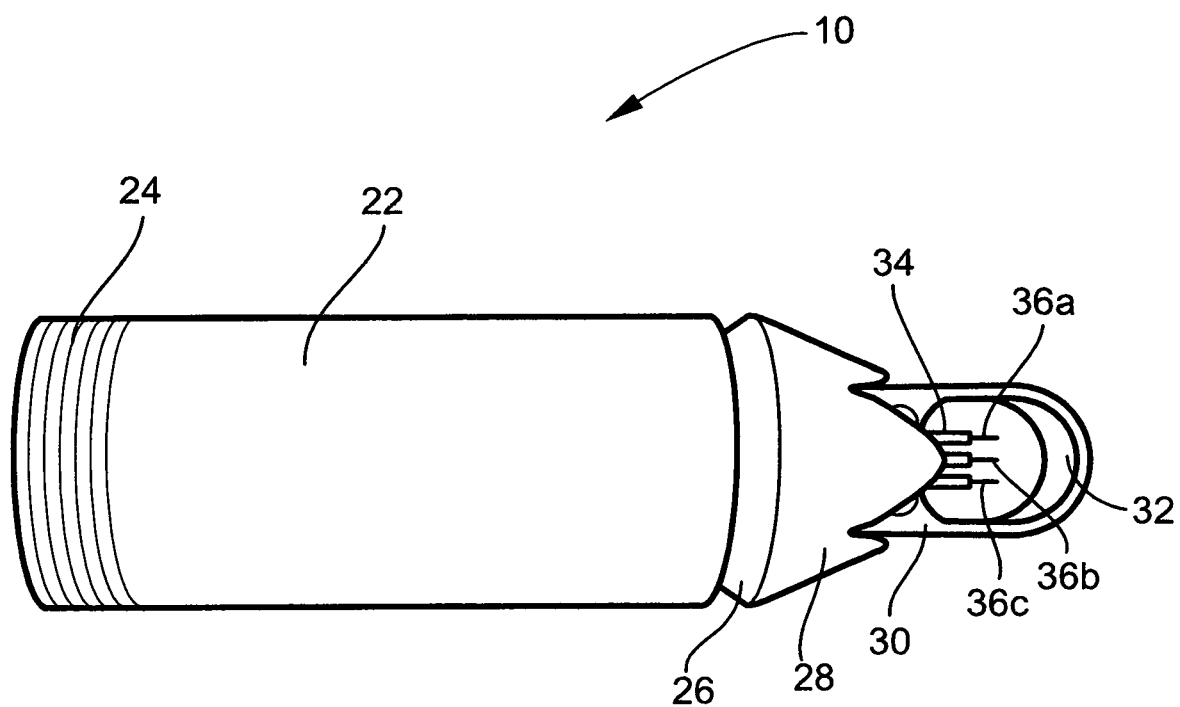
FIG. 2 is a side view of a TC gauge.

FIG. 2 is a side view of TC gauge 10. Gauge 10 may include an outer protective cover 22 made of, for example, black iron pipe or steel pipe. Cover 22 may have external threads 24 on one end. Threads 24 may engage internal threads of horizontal member 20 to thereby fix gauge 10 to field stand 12. Partially disposed in cover 22 is intermediate housing 26 having a conical end 28 extending out of cover 22. Conical end 28 has an aerodynamic shape that prevents gas from stagnating at the head of the TC gauge 10. A TC shell 30 is partially disposed in intermediate housing 26 and cover 22, and extends out of housing 26 can cover 22. The exposed end of shell 30 is in the form of a loop 32 that functions to shield multiple TCs 36a, 36b, 36c from gas flow and fragments created by an explosion. Shield loop 32 and the robust structure of gauge 10 enable gauge 10 to be pointed directly at the source of an explosion, such as explosive device 38 shown schematically in FIG. 1.

Figure 3:
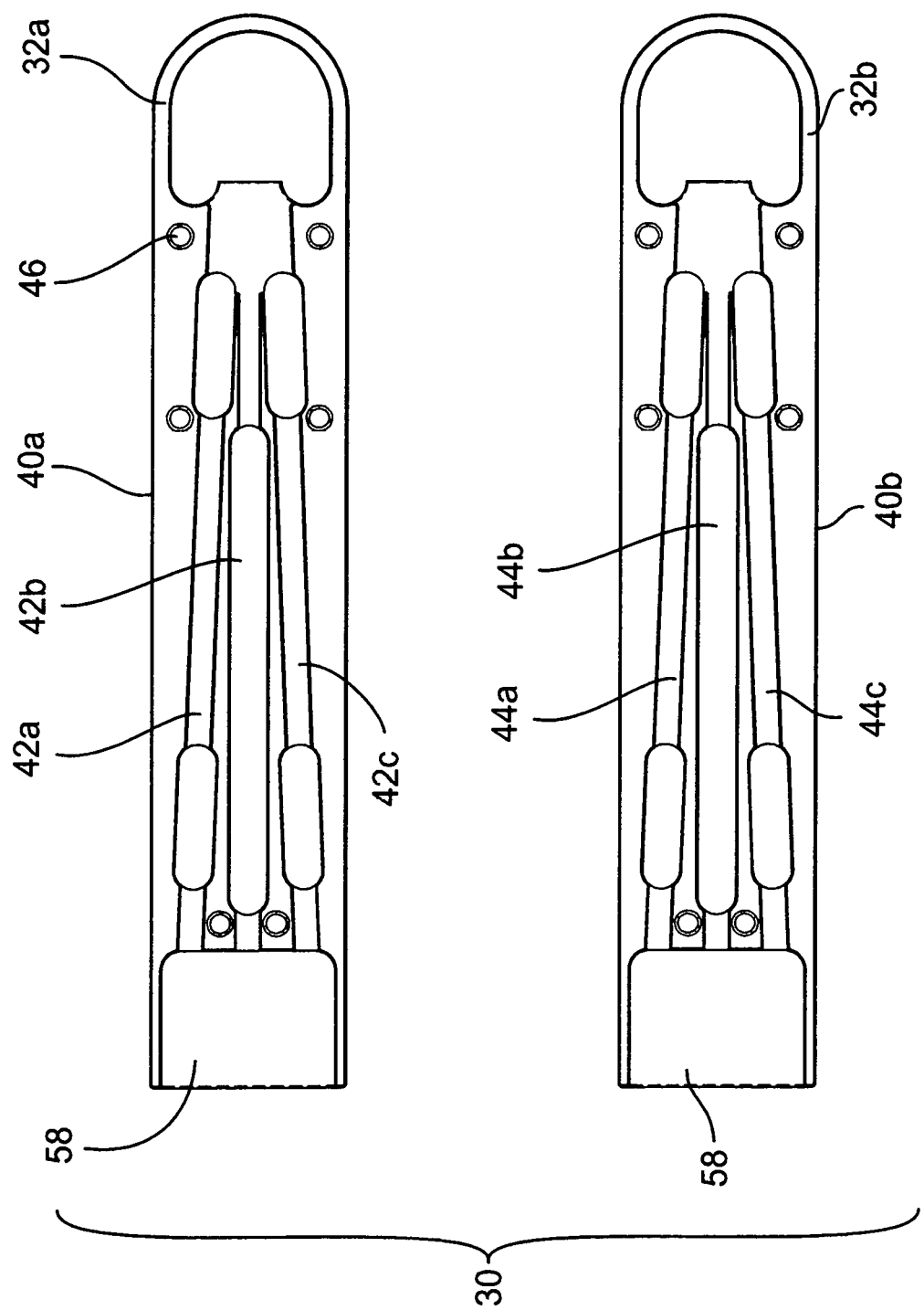
FIG. 3 shows two halves of a TC shell.

As seen in FIG. 3, TC shell 30 may include shell halves 40a and 40b. Shell 30 may be machined from a metal, for example, stainless steel. One end of each half 40a, 40b includes a mating portion 32a, 32b of shield loop 32. In the case of three TCs, three channels 42a, 42b, 42c and 44a, 44b, 44c are formed in each half 40a, 40b. In the case of other numbers of TCs, fewer or more channels may be used. A plurality of threaded openings 46 may be included to fix the shell halves 40a, 40b together with fasteners after the TCs have been mounted therein.

Suitable TCs are available from, for example, Omega Engineering, 800 Connecticut Ave. Suite 5N01, Norwalk, Conn. 06854, USA. Exemplary C type TC wire may include 0.003" or 40 AWG (0-1750° C., 32-3200° F.); 0.005" or 36 AWG (0-1975° C., 32-3600° F.); 0.010" or 30 AWG (0-2325° C., 32-4200° F.); and 0.015" or 26 AWG (0-2325° C., 32-4200° F.). Exemplary K type TC wire may include 0.003" or 40 AWG (0-593° C., 32-1100° F.); 0.005" or 36 AWG (0-593° C., 32-1100° F.); 0.010" or 30 AWG (0-871° C., 32-1600° F.); and 0.015" or 26 AWG (0-871° C., 32-1600° F.).

Figure 5:
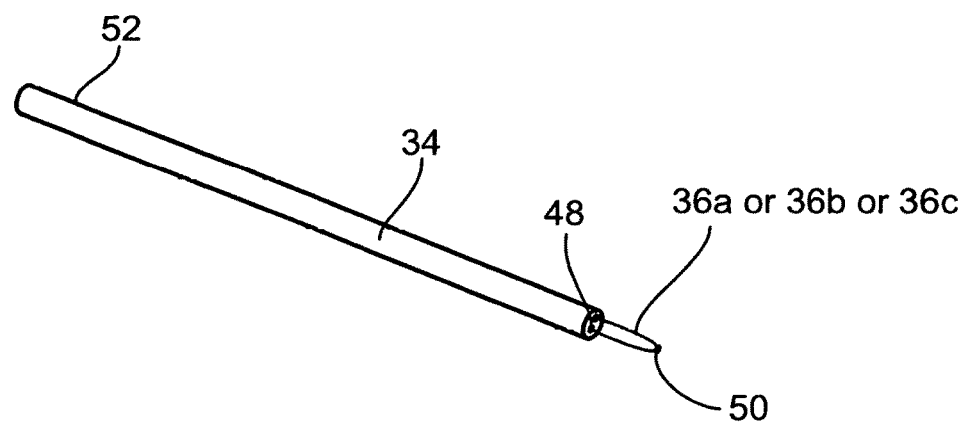
FIG. 5 is a perspective view of a TC mounted in a ceramic holder.
Figure 6:
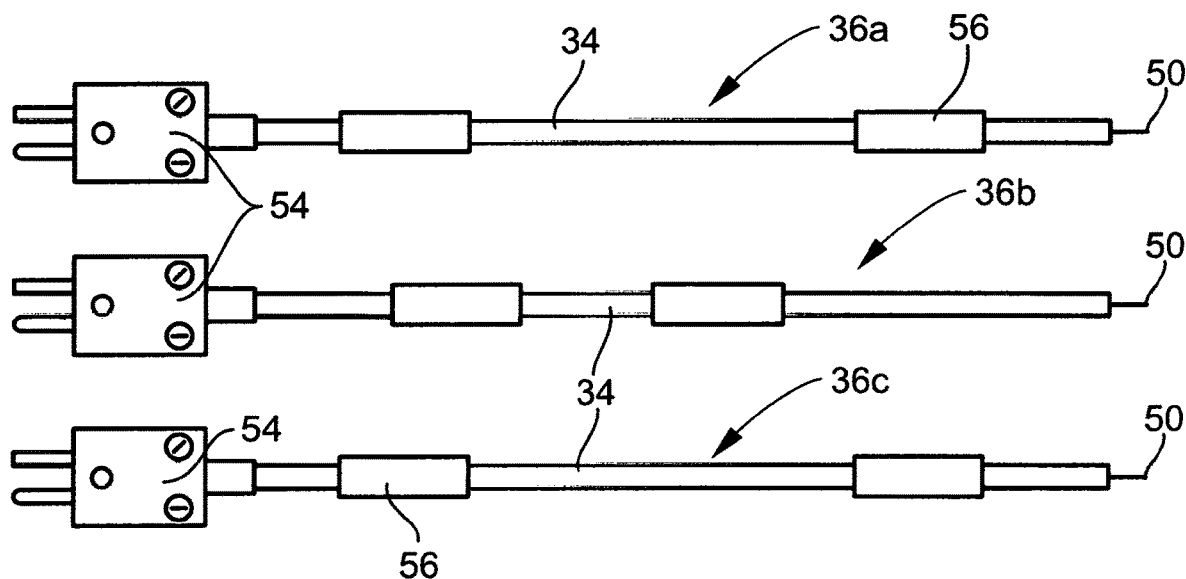
FIG. 6 is a schematic of three TC assemblies
Figure 6A:
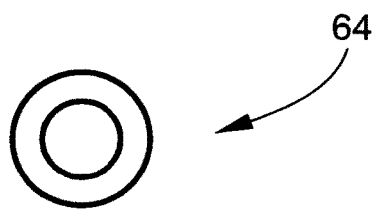
FIG. 6A is an end view of an O-ring.

As seen in FIG. 5, one step in constructing a TC assembly is threading a TC wire 36a, 36b or 36c through a ceramic holder 34 having two openings 48 therein. The bead 50 should extend out of the end of holder 34 by about 0.0125 to about 0.25 inches, for example. A grommet, such as a silicon clamp grommet, is placed over end 52 of the ceramic holder. As shown in FIG. 6, the TC pair at the grommet is connected to a male connector 54. Tubing 56 may be placed over each ceramic holder 34 to isolate vibration and thermal effects. Tubing 56 may be made of, for example, neoprene (polychloroprene) rubber. As an alternative to tubing 56, one or more O-rings 64 (FIG. 6A) may by placed around the ceramic holders 34.

Figure 4:
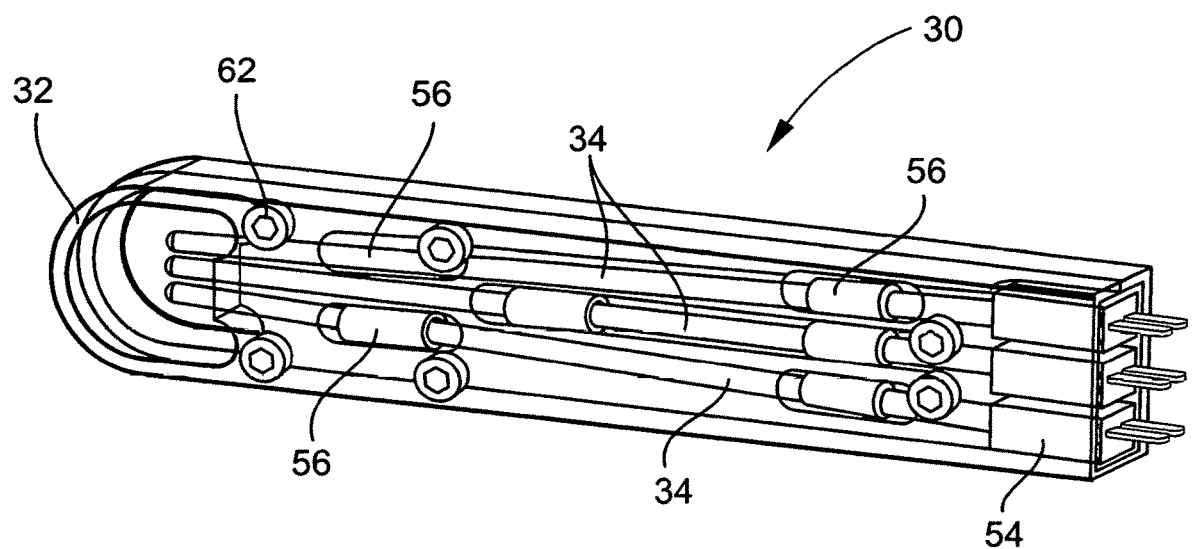
FIG. 4 is a perspective view of a TC shell showing the interior components.
Figure 7:
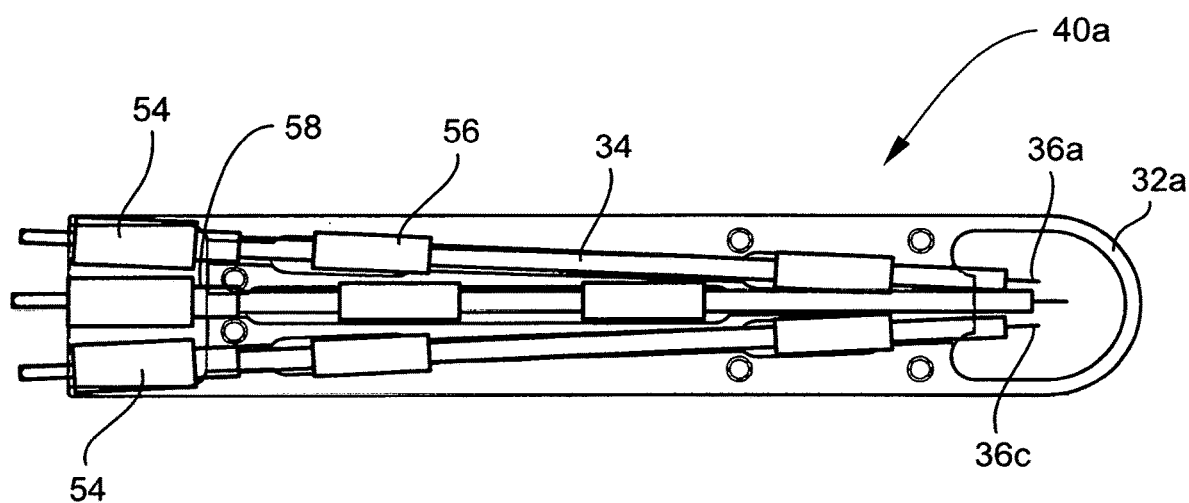
FIG. 7 is a side view of three TC assemblies disposed in one half of the shell of FIG. 3.
Figure 9:
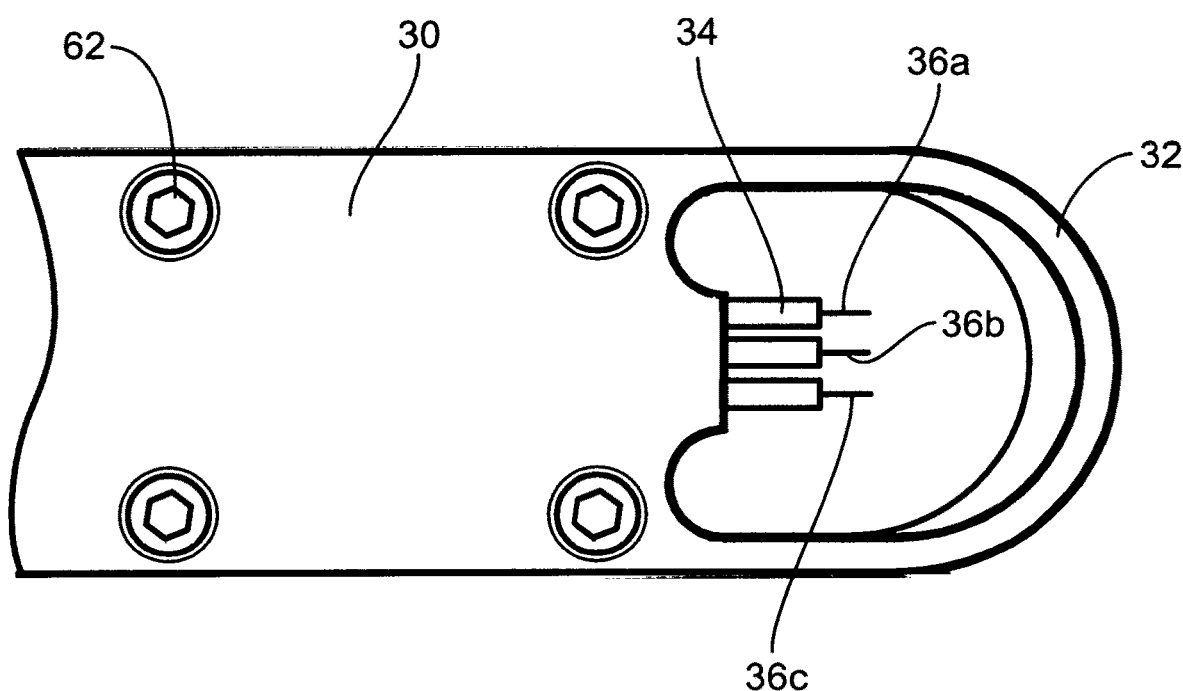
FIG. 9 is a partial side view showing the assembled TC shell.

Each TC assembly is then placed in one the half shells 40a, 40b such that the male connectors 54 rest in a recessed portion 58 (see FIG. 7) of the half shell. The other half of the TC shell is then fixed to the half containing the TC assemblies using fasteners 62 (FIG. 9) in threaded openings 46. FIG. 4 shows the interior components of the shell 30. As seen in FIG. 9, ends of the ceramic holders 34 are exposed enough to ensure that the thermocouple wires will not make contact with the TC shell 30 thereby causing a false temperature reading.

Figure 8:
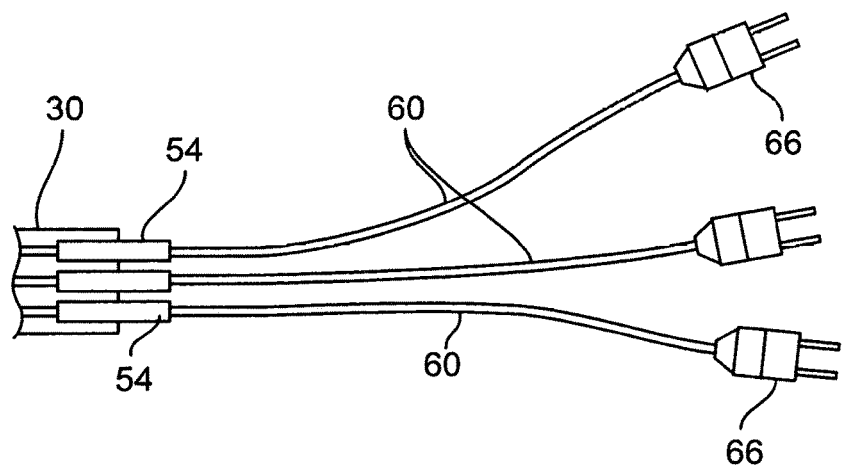
FIG. 8 is a schematic of TC extension wires.
Figure 8A:
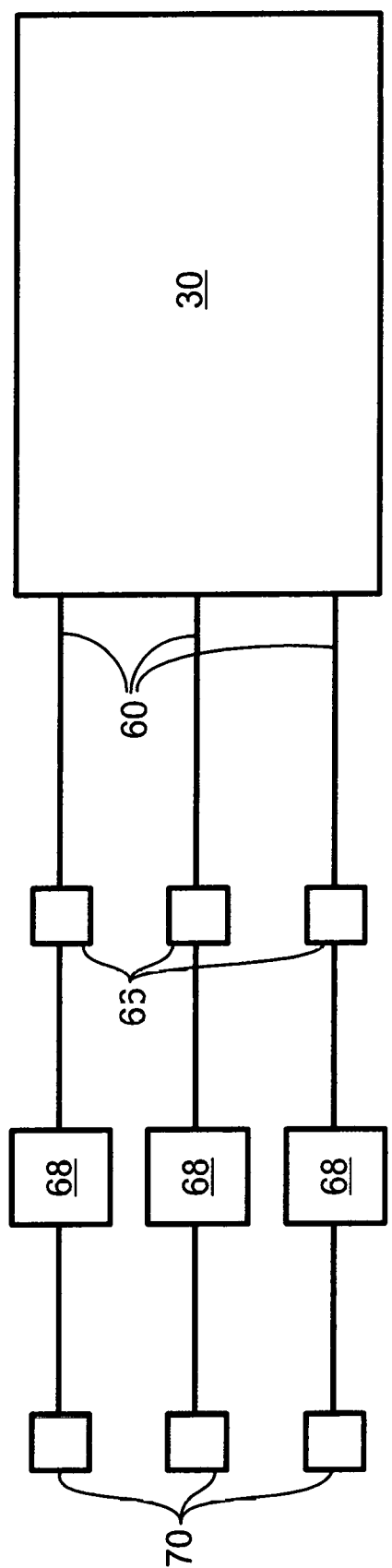
FIG. 8A is a schematic of amplifiers connected to the TC assemblies.

Extension wires 60 (FIG. 8) with male connectors 66 at one end may be connected to female connectors 54 for easier connection/disconnection. FIG. 8A is a schematic of amplifiers connected to the TC assemblies. Amplifiers 68, such as C-type amplifiers may be attached to the male connectors 66 on the ends of the extension wires 60. Amplifiers 68 include a power supply, such as a battery, and may terminate in a coaxial cable connecter 70, such as a BNC connector. Connector 70 is connected to additional cable (not shown) which leads to data processing equipment.

Figure 10:
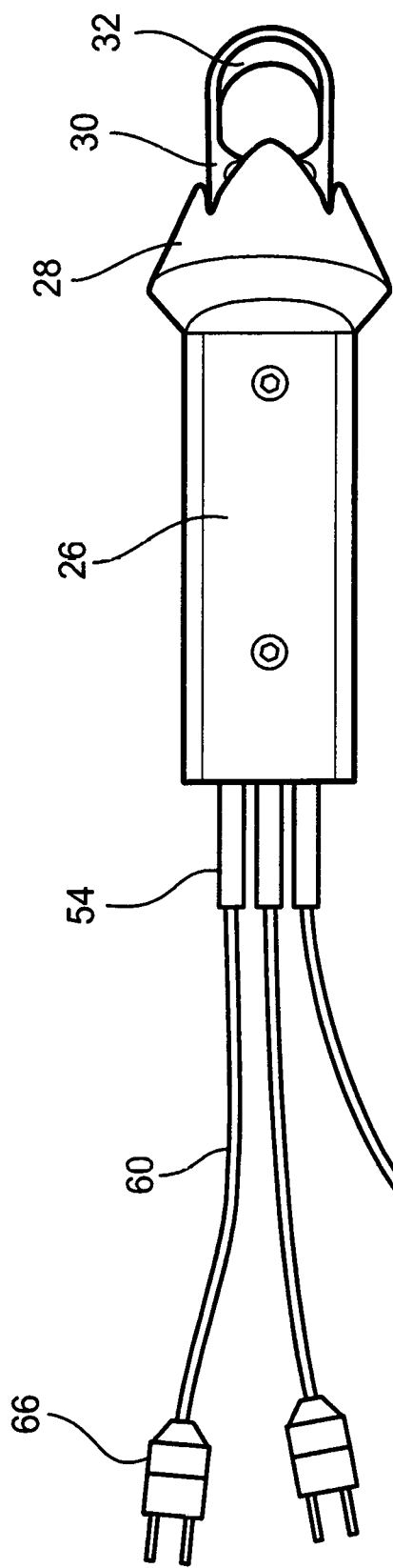
FIG. 10 is a side view of the assembled TC shell inserted in an intermediate housing.
Figure 10A:
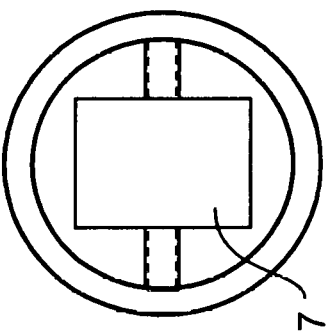
FIG. 10A is a rear view of an intermediate housing.
Figure 11:
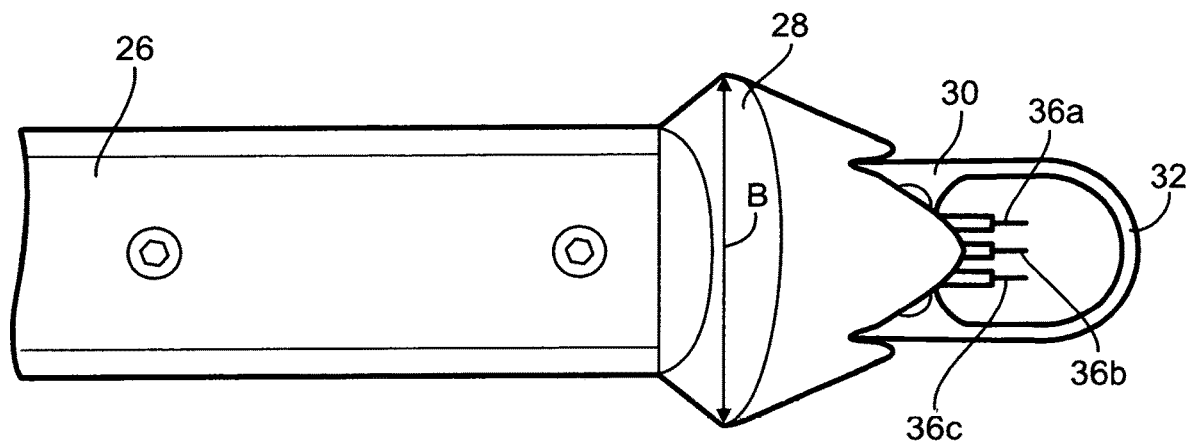
FIG. 11 is an enlarged side view of one end of FIG. 10.

As shown in FIGS. 10 and 11, TC shell 30 with TCs 36a, 36b, 36c installed therein is then placed in a central opening of an intermediate housing 26. FIG. 10A is a rear view of housing 26 showing the central opening 27 for the TC shell 30. Housing 26 may be made of, for example, stainless steel, steel or aluminum. Housing 26 may include a conical shaped end 28. Shield loop 32 of the thermocouple shell 30 extends out of the conical shaped end 28. The intermediate housing 26 may be fixed to the thermocouple shell 30 using, for example, set screws 72.

Figure 12:
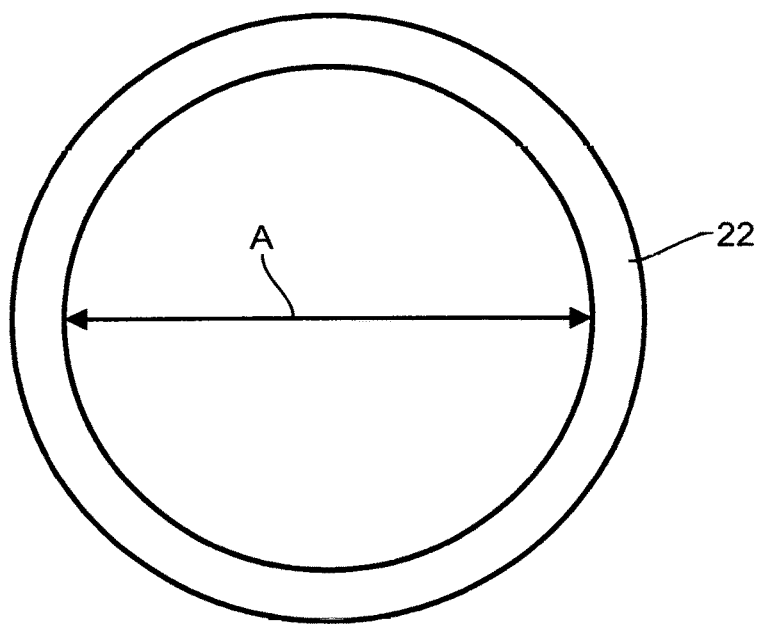
FIG. 12 is an end view of a tubular protective cover.

TC gauge 10 may include a tubular protective cover 22 (FIGS. 2 and 12) in which the intermediate housing 26 is disposed. The conical shaped end 28 of the intermediate housing extends out of the tubular protective cover 22. The inner diameter A (FIG. 12) of the tubular protective cover 22 may be less than a maximum diameter B (FIG. 11) of the conical shaped end 28. Cover 22 may be fixed to housing 26 using, for example, set screws.

Actual (Non-Hypothetical) Method for Reconstructing Temperatures

Figure 14:
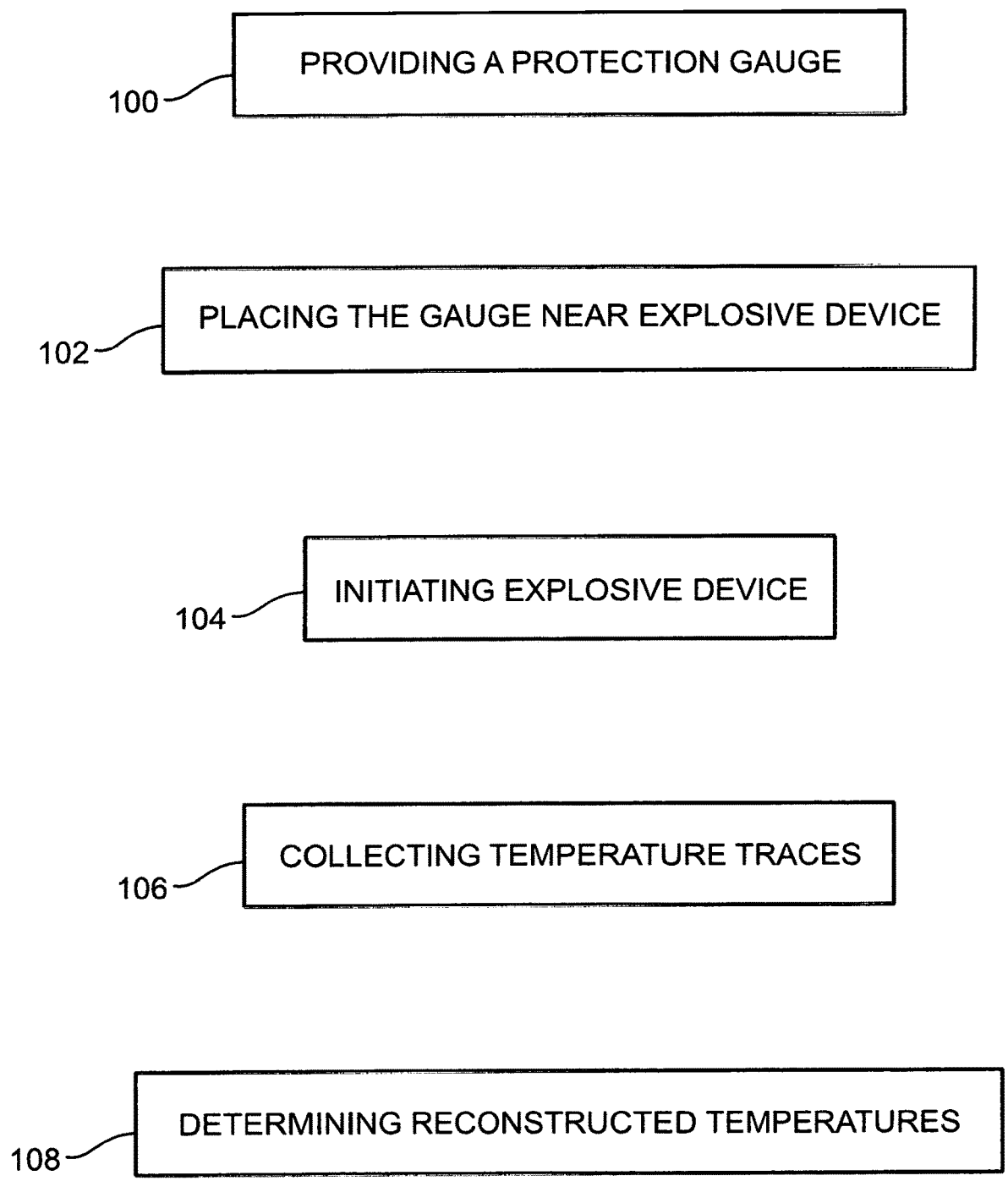
FIG. 14 is a block diagram of a method of measuring temperature.

Referring to FIG. 14, a method of measuring temperature in a blast field may include, at step 100, providing a protection gauge having at least three co-located thermocouples. Each thermocouple has a different bead diameter and time constant. At step 102, the gauge was placed near an explosive device such that the gauge is in a blast field of the explosive device. At step 104, the explosive device was initiated to create an explosive event. At step 106, temperature traces from each of the at least three co-located thermocouples were collected during at least a portion of the explosive event. At step 108, a reconstructed temperature trace for each of the at least three thermocouples was determined.

Figure 13:
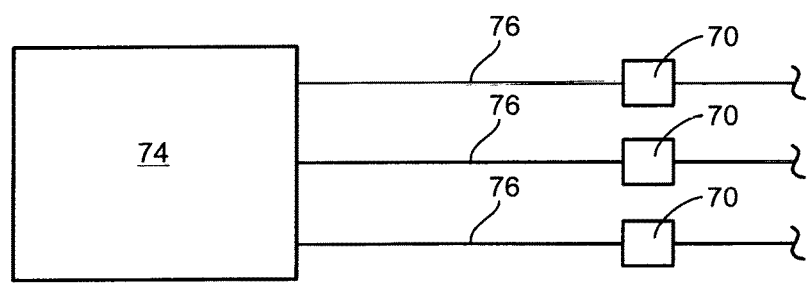
FIG. 13 is a schematic of a temperature data collection apparatus.

The three co-located TCs 36a, 36b, 36c inside the protection gauge 10 enable one to reconstruct the real gas temperature in an explosive fireball. The three TC time constants are determined in situ. Each of the three TCs has a different bead diameter and therefore has a different time resolved temperature trace. Temperature data may be obtained and processed via data cables 72 (FIG. 13) connected to the coaxial cable connectors 70 shown in FIG. 8A and to a suitable conventional data acquisition system and data processing unit 74. Data acquisition and processing unit 74 may include a variety of conventional computer components, such as processors, memories, input/output devices, etc. and data acquisition and processing software such as, for example, PICOSCOPE and MATLAB. The three individual temperature traces may be used to extrapolate the real gas temperature using a reconstruction method.

The novel method models each TC as a first order lag system. The method assumes that the gas temperature experienced by the TCs is the same and that the relative error between the true gas temperatures calculated from the method should be minimized. The minimization of the relative error may be implemented by solving for a single time constant for each TC that minimizes the sum of the squares of the differences between TC temperatures. A single TC pair provides one independent measurement of temperature while three TCs provide three independent measurements. In an alternative step, rather than a single time constant for each TC, each TC may have a variable, time dependent time constant.

The TC data is down-sampled, smoothed and corrected for spurious outlier noise using, for example, a combination of Savitzky-Golay averaging and outlier filling functions native to MATLAB. Reconstruction of the smoothed temperature data includes: calculation of the time derivative of the TC trace dT/dt (where T is thermocouple temperature and t is time); determination of the time constant τ by using a function minimization with constraints technique; and then using τ and dT/dt to reconstruct the gas temperatures ($T_g$) from the individual thermocouple traces. For a given time constant r, the gas temperature is reconstructed at each point in time using the equation:

$$T_{gx} = T_x + \tau_x \frac{dT_x}{dt}$$

where x indicates each different sized thermocouple.

The reconstruction method determines a single valued time constant for each thermocouple ($\tau_1$, $\tau_2$, $\tau_3$) that minimizes the sum of the squares of the deviations between gas temperatures measured by each thermocouple pair (denoted by E) at each point in time as shown in the equation:

$$E = \sum_{t=0}^{t=t_1} [(T_{g1} - T_{g2})^2 + (T_{g1} - T_{g3})^2 + (T_{g2} - T_{g3})^2]$$

Effectively, the time constant for each TC determined by the minimization is an "average" time constant in the flow. The resulting three, time-constant-optimized gas temperatures may be averaged at each time t to obtain a mean gas temperature $T_g$. There are effectively three (3) measurements of temperature.

Uncertainty in the measurement refers to the ability of the instrument to measure an accurate temperature. This uncertainty can be calibrated in a laboratory setting using a well-characterized temperature flowfield and known gradient. A sensitivity analysis to determine how the method responds to parameters like noise and smoothing may be useful to determine how temperature measurement error might be affected in the reconstruction process.

Figure 15:
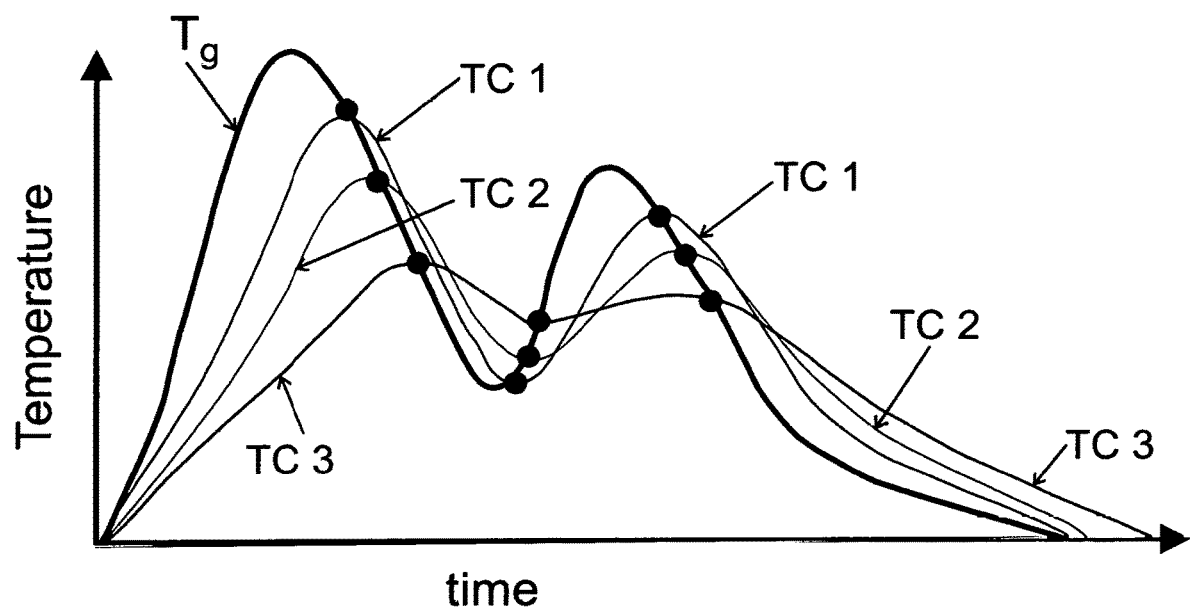
FIG. 15 is a graph illustrating an example of raw temperatures and an average of reconstructed temperatures.

Without a laboratory calibration or a comprehensive sensitivity analysis, the best estimate of instrument uncertainty comes from the multiple temperature measurements from each of the individual TCs at a single location. The estimation of time constants provides three independent measurements of gas temperature which are averaged together to determine the average gas temperature $T_g$ which has some associated standard error s. FIG. 15 is a graph illustrating an example of actual three raw thermocouple temperatures, TC 1, TC 2 and TC 3; and an average $T_g$ of the three reconstructed thermocouple temperatures.

Any numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A thermocouple (TC) gauge, comprising:
   a plurality of thermocouples, each of the plurality of thermocouples has a different wire size and time constant;
   a generally rectangular shell having mating halves, each half of the generally rectangular shell includes a plurality of channels formed therein to receive respective ones of the plurality of thermocouples;
   one end of the generally rectangular shell including a shield in the form of a loop wherein a bead of each thermocouple is disposed in an interior opening of the shield loop;
   for said each of the plurality of thermocouples, a ceramic holder having longitudinal openings therein for receiving said each of the plurality of thermocouples, wherein each of the ceramic holders is disposed in respective ones of the plurality of channels and the bead of each thermocouple extending beyond one end of the ceramic holder into the interior opening of the shield loop;
   vibration isolators being disposed around each ceramic holder in the plurality of channels; and
   electrical connectors being connected to said each of the plurality of thermocouples and disposed in a recessed area in an end of the shell opposite the shield loop.

2. The TC gauge of claim 1, wherein a number of the plurality of thermocouples is three and a number of the plurality of channels is three.

3. The TC gauge of claim 2, further comprising an intermediate housing having a central opening in which the thermocouple shell is fixed, the intermediate housing includes a conical shaped end from which the shield loop of the thermocouple shell extends.

4. The TC gauge of claim 2, further comprising an intermediate housing having a central opening in which the thermocouple shell is fixed, the intermediate housing includes a conical shaped end from which the shield loop of the thermocouple shell extends, wherein the intermediate housing is made of a sintered metal.

5. The TC gauge of claim 2, further comprising an intermediate housing having a central opening in which the thermocouple shell is fixed, the intermediate housing includes a conical shaped end from which the shield loop of the thermocouple shell extends, wherein the intermediate housing is fixed to the thermocouple shell with set screws.

6. The TC gauge of claim 2, further comprising an intermediate housing having a central opening in which the thermocouple shell is fixed, the intermediate housing includes a conical shaped end from which the shield loop of the thermocouple shell extends; and
   a tubular protective cover in which the intermediate housing being disposed, wherein the conical shaped end of the intermediate housing extends out of the tubular protective cover.

7. The TC gauge of claim 2, further comprising an intermediate housing having a central opening in which the thermocouple shell is fixed, the intermediate housing includes a conical shaped end from which the shield loop of the thermocouple shell extends; and
   a tubular protective cover in which the intermediate housing being disposed, wherein the conical shaped end of the intermediate housing extends out of the tubular protective cover, and wherein an inner diameter of the tubular protective cover is less than a maximum diameter of the conical shaped end.

8. The TC gauge of claim 2, further comprising an intermediate housing having a central opening in which the thermocouple shell is fixed, the intermediate housing includes a conical shaped end from which the shield loop of the thermocouple shell extends; and
   a tubular protective cover in which the intermediate housing being disposed, wherein the conical shaped end of the intermediate housing extends out of the tubular protective cover, wherein an inner diameter of the tubular protective cover is less than a maximum diameter of the conical shaped end, and wherein the tubular protective cover is made of pipe.

9. The TC gauge of claim 1, wherein the beads are co-located within about 0.5 cm of each other.

10. The TC gauge of claim 1, wherein the wire sizes are in a range of about 0.003 inches to about 0.015 inches.

* * * * *